US010117335B1

(12) United States Patent
Takahashi et al.

(10) Patent No.: US 10,117,335 B1
(45) Date of Patent: Oct. 30, 2018

(54) POWER MODULE

(71) Applicant: Mitsubishi Electric Corporation, Tokyo (JP)

(72) Inventors: Takuya Takahashi, Tokyo (JP); Yasutaka Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/845,022

(22) Filed: Dec. 18, 2017

(30) Foreign Application Priority Data

May 25, 2017 (JP) ................ 2017-103585

(51) Int. Cl.
*H05K 1/18* (2006.01)
*H01L 21/56* (2006.01)
*H01L 23/31* (2006.01)
*H01L 23/00* (2006.01)

(52) U.S. Cl.
CPC .......... *H05K 1/181* (2013.01); *H01L 21/561* (2013.01); *H01L 21/565* (2013.01); *H01L 23/3128* (2013.01); *H01L 24/45* (2013.01); *H01L 24/48* (2013.01); *H01L 24/73* (2013.01); *H01L 24/97* (2013.01)

(58) Field of Classification Search
CPC ..... H05K 1/181; H01L 21/561; H01L 21/565; H01L 23/3128; H01L 24/45; H01L 24/48; H01L 24/73; H01L 24/97

USPC ....................................................... 361/783
See application file for complete search history.

(56) References Cited

U.S. PATENT DOCUMENTS

| 8,873,247 | B2 | 10/2014 | Hosokawa | |
|---|---|---|---|---|
| 2016/0113107 | A1* | 4/2016 | Wang | H01L 24/00 361/783 |
| 2016/0155705 | A1* | 6/2016 | Mahajan | H01L 23/5381 438/107 |

FOREIGN PATENT DOCUMENTS

JP     2012-028513 A     2/2012

* cited by examiner

*Primary Examiner* — Michael P McFadden
(74) *Attorney, Agent, or Firm* — Studebaker & Brackett PC

(57) ABSTRACT

A power module includes a power semiconductor device, and a chip component arranged on first and second circuit patterns that are electrically connected to the power semiconductor device, and arranged so as to bridge the first and second circuit patterns. The chip component is arranged so that first and second electrodes are respectively positioned on the first and second circuit patterns, and the first and second electrodes and the first and second circuit patterns are respectively joined with solder layers. Between a lower surface of the chip component and the first circuit pattern and between the lower surface of the chip component and the second circuit pattern, two spacers are provided in parallel with each other respectively at positions close to the first and second electrodes. The solder layers do not exist on an inner side of the two spacers in parallel with each other.

8 Claims, 3 Drawing Sheets

POWER MODULE

BACKGROUND OF THE INVENTION

Field of the Invention

The present invention relates to a power module, and more particularly, to a power module capable of widening an operating temperature range thereof.

Description of the Background Art

A chip component that is mounted on a power module including a power semiconductor device is exposed to change due to heat generation of the power semiconductor device and to change of an environmental temperature. Of the chip components such as a capacitor, a resistor, a diode, and a thermistor, a capacitor or the like is formed of ceramics, for example, but a wiring pattern inside the power module is metallic, and hence there is a large difference in linear expansion coefficient between such members. In a conventional mounting method, a thickness of solder between the chip component and the wiring pattern is not controlled, and hence the thickness of the solder is considerably thin. Accordingly, in order to widen the operating temperature range, it is necessary to use a chip component having a special electrode structure that is resistant to a thermal stress but is costly.

Further, in a case where the chip components are mounted adjacently to each other, in the conventional method, it is necessary to widen an interval between the chip components or to provide walls between the chip components with a resist material so as to prevent the solder of the adjacent chip components from being joined.

On the other hand, in Japanese Patent Application Laid-Open No. 2012-28513, for example, there is disclosed a configuration in which a spacer member is provided directly under the chip component to lift up the chip component, thereby securing a length between the chip component and a wiring circuit board.

In the configuration of Japanese Patent Application Laid-Open No. 2012-28513, such a structure is taken as to embed the spacer inside the solder, which encloses the spacer inside the solder, and hence it is necessary to widen a solder region. For this reason, a joining area of the solder and the chip component becomes large, resulting in excessively firm joining of the solder and the chip component, and thus a larger stress is applied to the chip component.

When the operating temperature range of the power module is widened, it is considered that deflection due to the difference in linear expansion coefficient between members becomes large to further increase a bending stress to the chip component. Accordingly, it is necessary to reduce the joining area of the solder and the chip component, but there is a structural limitation in the configuration of Japanese Patent Application Laid-Open No. 2012-28513.

SUMMARY

It is an object of the present invention to provide a power module capable of alleviating a stress to a chip component arranged on a wiring pattern, and of widening an operating temperature range thereof.

A power module according to the present invention includes a power semiconductor device, and a chip component. The chip component is arranged on a first circuit pattern and a second circuit pattern that are electrically connected to the power semiconductor device, and arranged so as to bridge the first circuit pattern and the second circuit pattern. The chip component is arranged so that a first electrode and a second electrode are respectively positioned on the first circuit pattern and the second circuit pattern, and the first electrode and the second electrode and the first circuit pattern and the second circuit pattern are respectively joined with solder layers. Between a lower surface of the chip component and the first circuit pattern and between the lower surface of the chip component and the second circuit pattern, two spacers are provided in parallel with each other respectively at positions close to the first electrode and the second electrode. The solder layers do not exist on an inner side of the two spacers in parallel with each other.

According to the above-mentioned power module, it is possible to alleviate a stress to the chip component arranged on the wiring pattern, and to widen the operating temperature range thereof.

These and other objects, features, aspects and advantages of the present invention will become more apparent from the following detailed description of the present invention when taken in conjunction with the accompanying drawings.

DESCRIPTION OF THE PREFERRED EMBODIMENT

Preferred Embodiment

Figure 1:
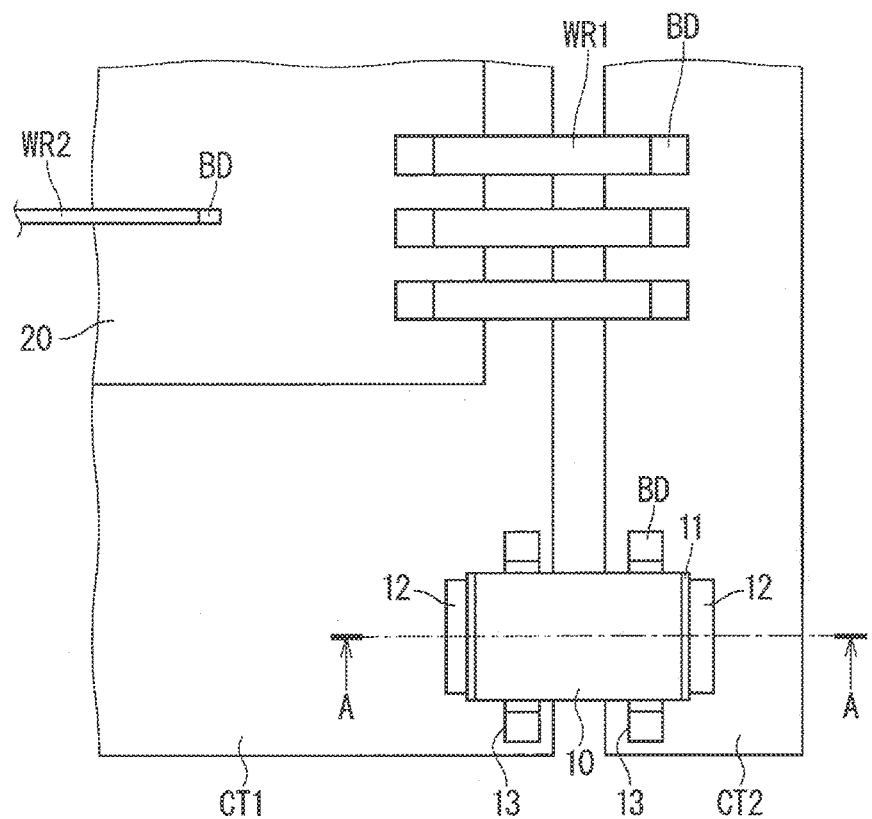
FIG. 1 is a plan view for illustrating a configuration of a power module according to a preferred embodiment of the present invention.

FIG. 1 is a plan view for illustrating a configuration of a power module 100 according to a preferred embodiment of the present invention. As illustrated in FIG. 1, the power module 100 includes a power semiconductor device 20, and a chip component 10 arranged on a circuit pattern CT1 and a circuit pattern CT2 that are electrically connected to main electrodes of the power semiconductor device 20 so as to bridge the circuit pattern CT1 and the circuit pattern CT2.

A main electrode on an upper surface side of the power semiconductor device 20 is electrically connected to the circuit pattern CT2 via a plurality of wires WR1 with wire bonding, and a main electrode on a lower surface side of the power semiconductor device 20 is electrically connected to the circuit pattern CT1 via solder (not shown). Further, a control electrode (not shown) is provided on the upper surface side of the power semiconductor device 20, and the control electrode is connected to a control circuit (not shown) or the like via a wire WR2 with wire bonding. Note that, the circuit patterns CT1 and CT2 are arranged on an insulating substrate, but illustration of the insulating substrate is omitted.

Electrodes 11 provided respectively on both end surfaces of the chip component 10 and the circuit patterns CT1 and CT2 are joined with solder layers 12, thereby electrically connecting the chip component 10 and the circuit patterns CT1 and CT2. Further, on a lower surface side of the chip component 10, spacers 13 are provided in parallel with each other respectively at positions close to the two electrodes 11 so as to be parallel with the electrodes 11 of the chip component 10.

The two spacers 13 are provided so as to protrude to the outer side with respect to lateral surfaces of the chip component 10 when viewed from the upper side, and are joined to the circuit patterns CT1 and CT2 at portions of bonding pads BD on the outer side of the chip component 10 with wire bonding.

Figure 2:
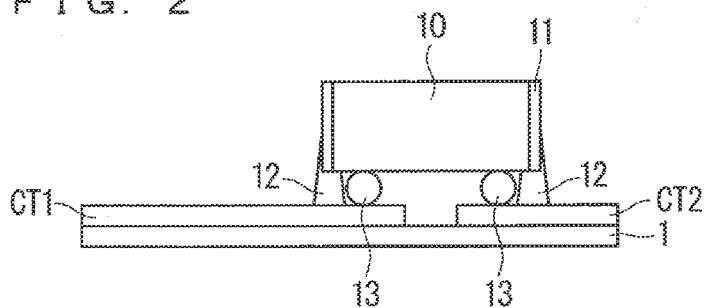
FIG. 2 is a sectional view for illustrating the configuration of the power module according to the preferred embodiment of the present invention.

A sectional configuration of the chip component 10 of FIG. 1 taken along the line A-A is illustrated in FIG. 2. As illustrated in FIG. 2, the circuit patterns CT1 and CT2 are arranged on an insulating substrate 1, and the spacers 13 having a circular sectional shape are provided between the lower surface of the chip component 10 and the circuit patterns CT1 and CT2. The solder layers 12 are provided so as to join a portion between surfaces of the electrodes 11 of the chip component 10 and upper surfaces of the circuit patterns CT1 and CT2. However, the solder layers 12 do not exist on an inner side of the spacers 13 (opposite side to the electrodes 11).

This is because of a gap between the chip component 10 and the circuit patterns CT1 and CT2 that is formed by providing the spacers 13, which causes a solder material to stagnate under the electrodes 11 due to surface tension when the solder material is melted, thereby inhibiting the solder material from advancing to the inner side of the spacers 13. For this reason, an arrangement region for the solder layers 12 is limited, and thus a solder joining area of the solder layers 12 and the chip component 10 can be reduced compared to a conventional method to prevent the solder layers 12 and the chip component 10 from being joined excessively firmly, thereby being capable of reducing a thermal stress to the chip component 10.

Note that, the sectional shape of the spacers 13 is formed into a circular shape, and hence a stress can be prevented from partially concentrating on the chip component 10.

Further, a thickness of the solder layers 12 can be controlled by providing the spacers 13, thereby being capable of reducing a thermal stress to the chip component 10 compared to a conventional method in which a thickness of solder is not controlled. Note that, in a case where aluminum (Al) wires are used as the spacers 13, the height thereof is set to be from 20 μm to 500 μm. This corresponds to a diameter of generally used Al wires.

Further, the spacers 13 are set to have such a length as to protrude to the outer side with respect to the lateral surfaces of the chip component 10, and hence the chip component 10 can be prevented from being dismounted from the spacers 13 due to displacement at the time of mounting the chip component 10.

Note that, wires are used as the spacers 13, and hence the thickness of the solder layers 12 can be controlled with a diameter of the wires, thereby being capable of optimizing assembly conditions of the chip component 10 in accordance with characteristics of the solder material.

Further, wires are used as the spacers 13, and hence, as illustrated in FIG. 1, the spacers 13 can be joined to the circuit patterns CT1 and CT2 with wire bonding, and a fixing operation of the spacers 13 can be performed using a bonding device of the power semiconductor device 20, thereby being capable of suppressing a manufacturing cost from being increased.

An outline of assembly procedure of the power module 100 in a case of using Al wires as the spacers 13 is as follows.

At positions to provide the spacers 13 of the circuit patterns CT1 and CT2 on the insulating substrate 1, Al wires are joined with ultrasonic bonding to fix the spacers 13. Next, a plate-like solder material is mounted at positions to provide the chip component 10 and the power semiconductor device 20, and the chip component 10 and the power semiconductor device 20 are mounted thereon. Then, the solder material is melted through a reflow process to join the chip component 10 and the power semiconductor device 20 and the circuit patterns CT1 and CT2 with the solder material.

Note that, in a case where cream solder is used as the solder material, it is desirable that the Al wires be joined with ultrasonic bonding at the positions to provide the spacers 13 after the solder material is printed at predetermined positions. With this, printing of the cream solder can be prevented from being obstructed by the Al wires.

Modified Example

Figure 3:
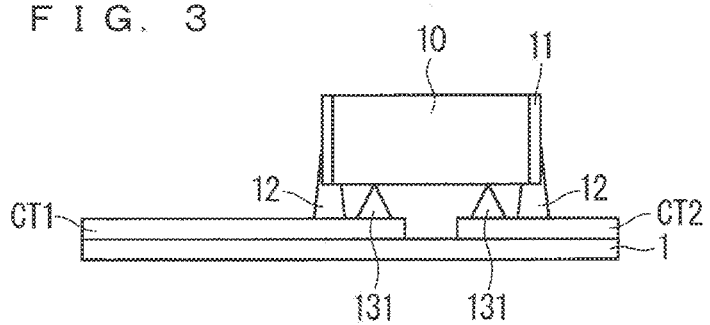
FIG. 3 is a sectional view for illustrating a modified example of spacers.
Figure 4:
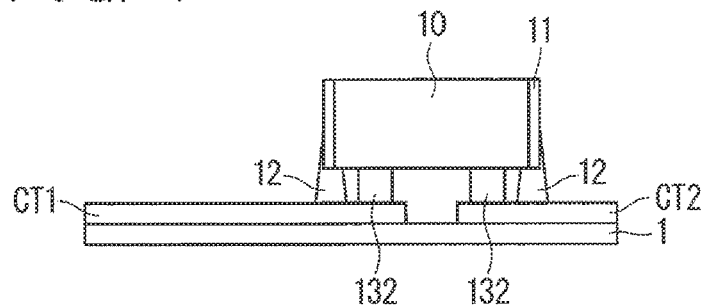
FIG. 4 is a sectional view for illustrating a modified example of spacers.
Figure 5:
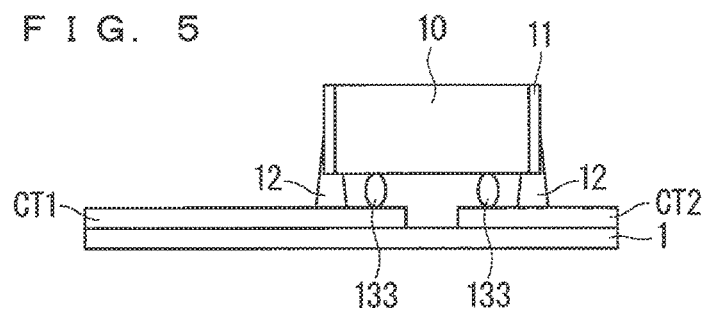
FIG. 5 is a sectional view for illustrating a modified example of spacers.

In the power module 100 described above, an example of using Al wires as the spacers 13 is illustrated, but the present invention is not limited thereto. For example, as illustrated in FIG. 3, spacers 131 having a triangle sectional shape may be used. Further, as illustrated in FIG. 4, spacers 132 having a quadrangular sectional shape may be used. Further, as illustrated in FIG. 5, spacers 133 having an elliptical sectional shape may be used.

In this case, the spacers 131, 132, and 133 are formed of metal such as Al having low wettability with respect to the solder material as compared to copper, gold, or the like, and hence the solder material can be prevented from flowing to spread to a pattern edge, the solder joining area of the solder layers 12 and the circuit patterns CT1 and CT2 can be reduced, and the solder layers 12 and the chip component 10 can be prevented from being joined excessively firmly, thereby being capable of reducing a thermal stress to the chip component 10.

Further, the material of the spacers 13, 131, 132, and 133, is not to be limited to Al, and materials having lower wettability with respect to the solder material than Al, such as a resin material of a solder resist or the like and a ceramic material, may also be used. In a case where a resin material of a solder resist or the like is used, chemical joining and joining to the circuit pattern with an adhesive may be adopted. In a case where a ceramic material is used, joining to the circuit pattern with brazing may be adopted. Further, as long as the solder material can be prevented from flowing into the inner side of the spacers, the circuit pattern may be subjected in advance to processing so as to partially protrude to function as the spacers. In such a case, the spacers 131, 132, and 133 further have advantages in processability for the sectional shapes thereof.

Further, in the power module 100 described above, as illustrated in FIG. 1, a configuration in which the power semiconductor device 20 and the chip component 10 are mounted on the common circuit patterns CT1 and CT2 is illustrated, but the configuration is not to be limited thereto.

<Another Example for Mounting of Chip Component>

In the power module 100 illustrated in FIG. 1, an example in which one chip component 10 is mounted on the circuit patterns CT1 and CT2 is illustrated, but the number of the chip components 10 to be mounted is not limited to one, and the present embodiment is effective also in a case where two or more chip components are mounted.

Figure 6:
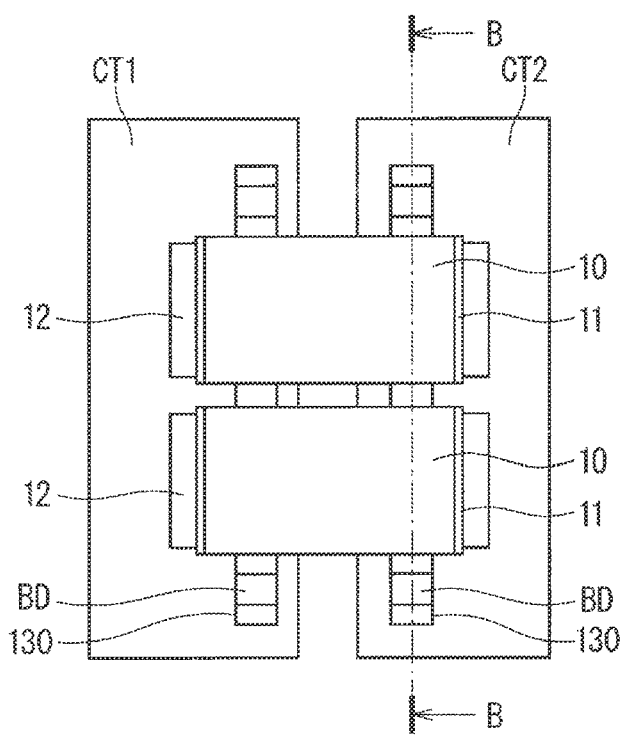
FIG. 6 is a plan view for illustrating a configuration in which a plurality of chip components are mounted.

FIG. 6 is a plan view for illustrating a configuration in which two chip components 10 are mounted in parallel on the circuit patterns CT1 and CT2. Note that, for the sake of convenience, only an array of the chip components 10 is illustrated in FIG. 6. As illustrated in FIG. 6, the two chip components 10 are arrayed so as to be parallel with each other and so as to bridge over the circuit patterns CT1 and CT2.

The electrodes 11 provided on end surfaces on one side of each of the two chip components 10 and the circuit pattern CT1 are joined with the solder layers 12, and the electrodes 11 provided on end surfaces on another side of each of the two chip components 10 and the circuit pattern CT2 are joined with the solder layers 12, thereby electrically connecting the two chip components 10 in parallel between the circuit patterns CT1 and CT2.

On the lower surface side of the two chip components 10, spacers 130 extending so as to be parallel with the electrodes 11 on one side of each of the two chip components 10, and spacers 130 extending so as to be parallel with the electrodes 11 on another side of each of the two chip components 10 are provided at positions close to the electrodes 11 respectively on one side and on another side.

The two spacers 130 are provided to have such a length as to protrude to the outer side with respect to outer lateral surfaces of the array of the two chip components 10 when viewed from the upper side, and are joined to the circuit patterns CT1 and CT2 at the portions of the bonding pads BD on the outer side of the array of the chip components 10 with wire bonding.

Figure 7:
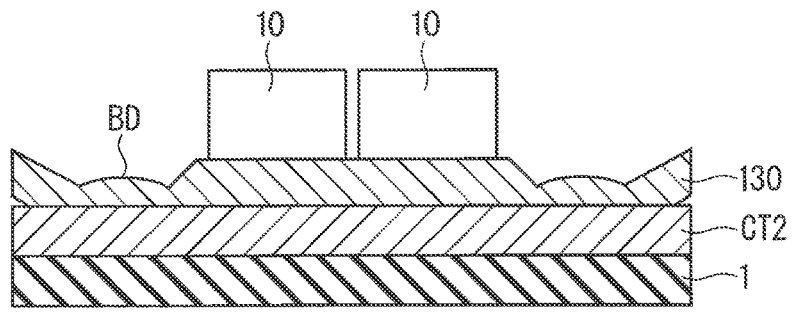
FIG. 7 is a sectional view for illustrating the configuration in which the plurality of chip components are mounted.

A sectional configuration of the chip components 10 of FIG. 6 taken along the line B-B is illustrated in FIG. 7. As illustrated in FIG. 7, lower surfaces of the chip components 10 come in contact with upper surfaces of the spacers 130, and are joined to the circuit patterns CT1 and CT2 at the portions of the bonding pads BD on the outer side of the array of both the two chip components 10, thereby being fixed.

In this manner, the bonding pads are not provided between the chip components, and thus an arrangement interval of the chip components 10 can be narrowed, thereby being capable of increasing a mounting density of the chip components 10.

That is, in a case where two or more chip components are mounted in parallel, in the conventional method, it is necessary to arrange a solder resist between the chip components in order to have a uniform thickness of the solder layers in the chip components. For this reason, the arrangement interval of the chip components is limited by the thickness of the solder resist, and thus the arrangement interval cannot be made smaller than the thickness of the solder resist. However, in the present example, nothing needs to be arranged between the chip components 10, thereby being capable of increasing the mounting density of the chip components 10.

Note that, in FIG. 6, an example in which the two chip components 10 are electrically connected in parallel between the circuit patterns CT1 and CT2 is illustrated, but it is also possible to electrically connect the two chip components 10 in series by changing a shape of the circuit pattern in plan view.

Figure 8:
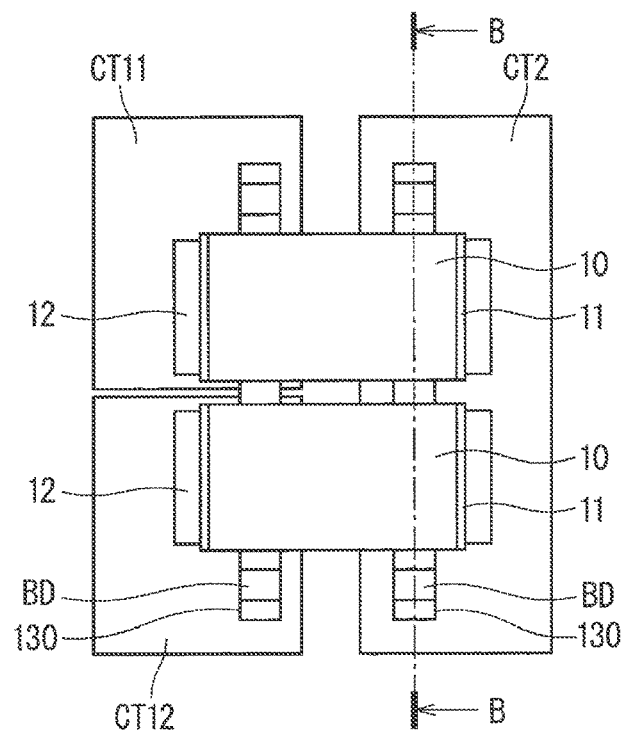
FIG. 8 is a plan view for illustrating a configuration in which the plurality of chip components are electrically connected in series.

That is, as illustrated in FIG. 8, in a case where the circuit pattern CT1 is made of two independent circuit patterns CT11 and CT12, the spacer 130 is arranged on the circuit patterns CT11 and CT12 so as to bridge across the circuit patterns CT11 and CT12, and the spacer 130 is arranged on the circuit pattern CT2. The electrode 11 on the circuit pattern CT11 is joined to the circuit pattern CT11 with the solder layer 12, and the electrode 11 on the circuit pattern CT12 is joined to the circuit pattern CT12 with the solder layer 12, thereby being capable of electrically connecting the two chip components 10 in series.

In this case, the spacers 130 are formed of an insulating material such as a resin material and a ceramic material, and thus the two chip components 10 are prevented from being short-circuited even when the spacers 130 come in contact with the solder layers 12.

<Application to Wide-Bandgap Semiconductor Device>

A wide-bandgap semiconductor device that uses a wide-bandgap semiconductor having larger band gaps than a silicon (Si) semiconductor, such as a silicon carbide (SiC) semiconductor and a gallium nitride (GaN) semiconductor, has excellent withstand voltage property, has a high allowable current density, and also has high heat resisting property as compared to the Si semiconductor device that uses a Si semiconductor, and hence operations can be performed under a high temperature.

Figure 9:
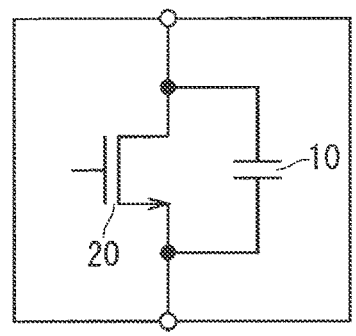
FIG. 9 is a view for illustrating a configuration in which the chip components are connected in parallel on a power semiconductor device.

In FIG. 9, there is illustrated a configuration of a module having the capacitor 10 as the chip component that is connected in parallel to the MOS transistor 20 as the power semiconductor device, in which the capacitor 10 functions as a snubber capacitor to suppress a surge voltage. Note that, in an RC snubber circuit, a resistance element is connected in series to a capacitor, but the illustration thereof is omitted for the sake of simplicity.

The chip component that forms a protection circuit as the capacitor 10 is arranged close to the power semiconductor device 20 as illustrated in FIG. 1. When a wide-bandgap semiconductor device is used as the power semiconductor device, operations can be performed under a high temperature, and hence a thermal stress to the chip component 10 becomes larger compared to the case of using a Si semiconductor device.

However, in the power module 100 according to the preferred embodiment of the present invention, the spacers 13 are provided under the chip component 10, and hence the solder joining area of the solder layer 12 and the chip component 10 can be reduced and the solder layer 12, and the chip component 10 are prevented from being joined excessively firmly, thereby being capable of reducing a thermal stress to the chip component 10. Further, the spacers 13 are provided, which can thicken the solder layers 12, thereby being capable of reducing a thermal stress to the chip component 10. For this reason, even in a case where operations are performed under a high temperature using the wide-bandgap semiconductor device, it is possible to reduce generation of defects in the chip component 10 due to a thermal stress.

Note that, in the description above, a surface mounting capacitor is exemplified as the chip component 10, but the present embodiment and the present example are applicable to a chip component assuming surface mounting, such as a resistor, a diode, and a thermistor.

Note that, in the present invention, the preferred embodiment may be modified or omitted as appropriate in the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A power module, comprising:
a power semiconductor device; and
a chip component arranged on a first circuit pattern and a second circuit pattern that are electrically connected to said power semiconductor device, and arranged so as to bridge said first circuit pattern and said second circuit pattern, wherein:
said chip component is arranged so that a first electrode and a second electrode are respectively positioned on said first circuit pattern and said second circuit pattern, and said first electrode and said second electrode and said first circuit pattern and said second circuit pattern are respectively joined with solder layers;
between a lower surface of said chip component and said first circuit pattern and between the lower surface of said chip component and said second circuit pattern, two spacers are provided in parallel with each other respectively at positions close to said first electrode and said second electrode; and
said solder layers do not exist on an inner side of said two spacers in parallel with each other.

2. The power module according to claim 1, wherein said two spacers are provided so as to protrude to an outer side with respect to a lateral surface of said chip component in plan view.

3. The power module according to claim 2, wherein said two spacers each comprise a wire, and are joined to said first circuit pattern and said second circuit pattern with wire bonding.

4. The power module according to claim 1, wherein:
said chip component comprises a plurality of chip components that are arrayed so as to be parallel with each other and are arranged so as to bridge said first circuit pattern and said second circuit pattern; and
said two spacers have a length allowing each of said plurality of chip components to be mounted thereon, and are provided so as to protrude to an outer side with respect to a lateral surface of an array of said plurality of chip components in plan view.

5. The power module according to claim 4, wherein said two spacers each comprise a wire, and are joined to said first circuit pattern and said second circuit pattern with wire bonding.

6. The power module according to claim 1, wherein a sectional shape of said two spacers comprises a circular shape.

7. The power module according to claim 1, wherein said two spacers each comprise metal having comparatively low wettability with respect to a solder material.

8. The power module according to claim 1, wherein said power semiconductor device comprises a wide-bandgap semiconductor device.

* * * * *